United States Patent
Okuda et al.

(10) Patent No.: US 10,286,426 B2
(45) Date of Patent: May 14, 2019

(54) COLUMNAR LAMINAR FLOW GENERATION DEVICE AND METHOD FOR GENERATING COLUMNAR LAMINAR FLOWS

(71) Applicants: NATIONAL INSTITUTE OF ADVANCED INDUSTRIAL SCIENCE AND TECHNOLOGY, Tokyo (JP); LITHO TECH JAPAN CORPORATION, Kawaguchi, Saitama (JP); ORIENTAL MOTOR CO., LTD., Tokyo (JP)

(72) Inventors: Shuuji Okuda, Tsukuba (JP); Sommawan Khumpuang, Tsukuba (JP); Shiro Hara, Tsukuba (JP); Sho Takeuchi, Saitama (JP); Yoshihisa Sensu, Saitama (JP); Takahiro Ito, Tsukuba (JP)

(73) Assignees: NATIONAL INSTITUTE OF ADVANCED INDUSTRIAL SCIENCE AND TECHNOLOGY, Tokyo (JP); LITHO TECH JAPAN CORPORATION, Kawaguchi (JP); ORIENTAL MOTOR CO., LTD., Tokyo (JP)

( * ) Notice: Subject to any disclaimer, the term of this patent is extended or adjusted under 35 U.S.C. 154(b) by 46 days.

(21) Appl. No.: 15/260,691

(22) Filed: Sep. 9, 2016

(65) Prior Publication Data
US 2017/0072438 A1    Mar. 16, 2017

(30) Foreign Application Priority Data
Sep. 11, 2015  (JP) ................. 2015-180083

(51) Int. Cl.
*B08B 5/02* (2006.01)
*B08B 15/00* (2006.01)
*H01L 21/67* (2006.01)

(52) U.S. Cl.
CPC ............. *B08B 5/02* (2013.01); *B08B 15/00* (2013.01); *H01L 21/6715* (2013.01); *H01L 21/67017* (2013.01)

(58) Field of Classification Search
CPC ..... B08B 5/02; B08B 15/00; H01L 21/67017; H01L 21/6715; C23C 16/455; C23C 16/45519
See application file for complete search history.

(56) References Cited

U.S. PATENT DOCUMENTS

2008/0073030 A1* 3/2008 Yoshino ............ H01L 21/31111
156/345.11

FOREIGN PATENT DOCUMENTS

| JP | 61128523 A | * | 6/1986 |
| JP | H11218353 A |  | 8/1999 |
| JP | 2015109293 A |  | 6/2015 |

OTHER PUBLICATIONS

Machine translation: JP61128523; Iwata, Y. (Year: 1986).*

* cited by examiner

*Primary Examiner* — Mikhail Kornakov
*Assistant Examiner* — Natasha N Campbell
(74) *Attorney, Agent, or Firm* — Law Office of Katsuhiro Arai (57) ABSTRACT

A columnar laminar flow generation device includes: a placement part on which to place a processing target; a gas blow-out part having an opening; and a gas suction path; wherein the placement part is positioned in a space whose outer periphery surface is constituted by extending the interior wall of the opening in the direction vertical to the

(Continued)

opening; the opening has, in its interior wall, a gas blow-out port through which a gas is blown out in one direction vertical to the opening; and the gas suction path is formed in such a way that it suctions the gas in the direction opposite to the one in which the gas is blown out. The columnar laminar generation device is capable of generating columnar laminar flows.

20 Claims, 8 Drawing Sheets

COLUMNAR LAMINAR FLOW GENERATION DEVICE AND METHOD FOR GENERATING COLUMNAR LAMINAR FLOWS

BACKGROUND

Field of the Invention

The present invention relates to a columnar laminar flow generation device, as well as a method for generating columnar laminar flows.

Description of the Related Art

In such technical fields as semiconductor manufacturing, MEMS manufacturing, image display device manufacturing, ultraviolet light irradiation treatment and coating, there is a practice of controlling the ambience constant by discharging gases while introducing a replacement gas whose cleanliness level, gas type, etc., have been controlled, in order to eliminate dust and other foreign matters, eliminate active gases, and control temperature and humidity, etc.

Discharging gases containing foreign matter, etc., active gases, and gases whose temperature and humidity are not desired (hereinafter referred to as "gases to be replaced") is difficult if a replacement gas is arbitrarily blown into the space because it only disturbs the flows of gases and generates turbulent flows. Undisturbed gas flows, or specifically gas flows where the gas flows linearly in one direction without generating any vortex, are called "laminar flows" or "one-directional flows," and by blowing in replacement gases as laminar flows, the gases to be replaced can be discharged quickly from the space. Among different types of laminar flows, those which are generated by introducing a replacement gas by exactly the same volume as that of the applicable space and which can discharge all gases to be replaced as if they are pushed out by a piston, are called "piston flows" representing laminar flows of the highest replacement efficiency.

Normally, generating laminar flows requires that a fan filter unit comprising fans integrally assembled with HEPA filters, ULPA filters, or other high-performance filters be installed over the entire ceiling surface providing blow-out ports, while gratings, etc., be installed over the entire floor surface providing suction ports, so that structurally gases are blown out to the space and exhausted from the space uniformly from the top and bottom (Patent Literature 1).

With the conventional uniform blow-out/exhaust structure, generating laminar flows requires that a gas be pushed out at strong pressure through the high-performance filters, where the flow velocity of the gas as it is blown out through the high-performance filters reaches approx. 350 mm/sec. And, to purify air, the filters must be made thicker to accommodate higher velocities. High-performance filters used in semiconductor manufacturing have a folded structure and some thickness to reduce pressure losses, where filters of 20 to 30 cm in thickness are used.

The uniform blow-out/exhaust structure must use large, powerful fans to push out the gas at a high flow velocity of 350 mm/sec or so through the filters that are 20 to 30 cm thick. Also, a huge volume of gas is pushed out at high flow velocity throughout the ceiling surface, which requires large gas-circulation pumps as well as large-scale air-conditioning apparatuses, humidifiers, etc., for keeping the gas temperature and humidity constant. This is why clean rooms require a huge initial facility investment. Also, clean rooms operate at all times, incurring large electricity and water bills for large-scale fans, air-conditioning apparatuses, etc., as well as running costs including the cost of filters that must be replaced regularly.

Here, it should be noted that, in fields where laminar flows are used, the area of the region where gases must be replaced by laminar flows is only a fraction of the actual area where laminar flows are generated. For example, a semiconductor manufacturing plant uses a large-scale clean room in which multiple manufacturing devices are installed, but in reality, only those locations where wafers travel, or if wafers are in sealed transfer containers, only where the wafer processing device docks to the sealed transfer containers, need to be cleaned.

To control the ambience only in the region where such control is actually required, the inventors of the present invention proposed a reagent treatment cup with gas ejection ports provided near the outer rim of the top opening of the cup, where a gas is ejected toward the center of the top opening to fill the reagent treatment cup with the gas and also prevent the outside air from entering the reagent treatment cup (Patent Literature 2).

BACKGROUND ART LITERATURES

[Patent Literature 1] Japanese Patent Laid-open No. Hei 11-218353

[Patent Literature 2] Japanese Patent Laid-open No. 2015-109293

SUMMARY

An object of the present invention is to provide a columnar laminar flow generation device capable of generating columnar laminar flows.

Any discussion of problems and solutions involved in the related art has been included in this disclosure solely for the purposes of providing a context for the present invention, and should not be taken as an admission that any or all of the discussion were known at the time the invention was made.

1) A columnar laminar flow generation device comprising: a placement part on which to place a processing target; a gas blow-out part having an opening; and a gas suction path; wherein such columnar laminar flow generation device is characterized in that: the placement part is positioned in a space whose outer periphery surface is constituted by extending the interior wall of the opening in the direction vertical to the opening; the opening has, in its interior wall, a gas blow-out port through which a gas is blown out in one direction vertical to the opening; and the gas suction path is formed in such a way that it suctions the gas in the direction opposite to the one in which the gas is blown out.

2) A columnar laminar flow generation device according to 1), characterized in that the gas blow-out port is formed so that the gas is blown out upward.

3) A columnar laminar flow generation device according to 1) or 2), characterized in that the placement part is rotatable.

4) A columnar laminar flow generation device according to any one of 1) to 3), characterized in that a feed pipe that supplies the gas to the gas blow-out part has a filter.

5) A wafer processing device characterized in that it is fitted with a columnar laminar flow generation device according to any one of 1) to 4).

6) A rotary application device characterized in that it is fitted with a columnar laminar flow generation device according to 3) or 4).

7) A method for generating columnar laminar flows characterized by comprising: blowing out a gas from a gas blow-out port provided in the interior wall of an opening, in one direction vertical to the opening; suctioning the gas in the direction opposite to the one in which the gas is blown out from the opening; and generating columnar laminar flows passing through the opening.

By using the columnar laminar flow generation device proposed by the present invention, laminar flows can be generated locally. Unlike under the conventional method whereby laminar flows are generated by using blow-out ports and suction ports provided over the entire ceiling surface and entire floor surface, respectively, of a room in which a manufacturing device is installed, or of a manufacturing device, laminar flows can be formed only in the region where laminar flows are ordinarily required. Also, the columnar laminar flow generation device proposed by the present invention can generate, according to the shape of its opening, columnar laminar flows of any size or cross-section shape. In many cases, the region where the ambience must be controlled using laminar flows is one-tenth the total ceiling area or less, and by using the columnar laminar flow generation device proposed by the present invention to generate laminar flows only in the necessary region, the amount of replacement gas can be reduced to one-tenth or less.

Furthermore, the columnar laminar flow generation device proposed by the present invention can adjust the velocity of laminar flows according to the gas suction rate. Laminar flows can be generated at any flow velocity, not limited to 350 mm/sec or so which is the only feasible velocity under the conventional method. For example, slowing the flow velocity to one-tenth reduces the amount of replacement gas to be blown out per unit time, and if the area of laminar flows remains the same, the amount of replacement gas can be reduced to one-tenth.

The columnar laminar flow generation device proposed by the present invention can generate laminar flows of low velocity solely at the desired locations. For example, by reducing the area to one-tenth and the flow velocity to one-tenth, the required amount of replacement gas can be reduced to one-hundredth or less compared to when the conventional method is used. Even when the flow rate is increased by keeping the flow velocity similar to the level under the conventional method for the purpose of controlling temperature and humidity, the amount of replacement gas can still be cut to one-tenth or so compared to when the conventional method is used.

Reduction of the required amount of replacement gas allows for size reduction of the fan to push out the replacement gas and the energy required to control temperature and humidity of the replacement gas can also be reduced. Also, providing a filter in the feed pipe is all that is needed to purify the replacement gas, which substantially decreases the required quantity of filters.

Furthermore, use of the columnar laminar flow generation device proposed by the present invention allows for size reduction of the device needed to control the replacement gas, resulting in substantial reductions in the usage of energy, water, etc. The ability to reduce the sizes of the device needed to control the replacement gas also saves space, reduces noise, and reduces heat generation, etc.

The wafer processing device and rotary application device fitted with the columnar laminar flow generation device proposed by the present invention can achieve the same degree of cleanliness as under the conventional method because laminar flows are generated locally only where an ambience of replacement gas is required.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are greatly simplified for illustrative purposes and are not necessarily to scale.

DESCRIPTION OF THE SYMBOLS

100 Columnar laminar flow generation device
1 Placement part
11 Rotating part
12 Outer cylinder member
2 Gas blow-out part
21 Opening
22 Gas blow-out port
23 Feed pipe
24 Flow passage
241 Circular path
242 Connection path
243 Circular space
244 Distribution wall 245 Slit
3 Gas suction path
31 Trap
400 Minimal resist coating device
41 Device front chamber
411 Container placement table
412 Hold-down lever
413 Operation button
414 Operation panel
42 Processing chamber
25 Cylindrical blow-out port
26 Cylinder member

DETAILED DESCRIPTION OF EMBODIMENTS

The present invention relates to a columnar laminar flow generation device comprising: a placement part on which to place a processing target; a gas blow-out part having an opening; and a gas suction path; wherein the placement part is positioned in a space whose outer periphery surface is constituted by extending the interior wall of the opening in the direction vertical to the opening; the opening has, in its interior wall, a gas blow-out port through which a gas is blown out in one direction vertical to the opening; and the gas suction path suctions the gas in the direction opposite to the one in which the gas is blown out.

Here, it should be noted that, under the present invention, the direction vertical to the opening means the direction vertical to the plane that includes the opening.

Figure 1:
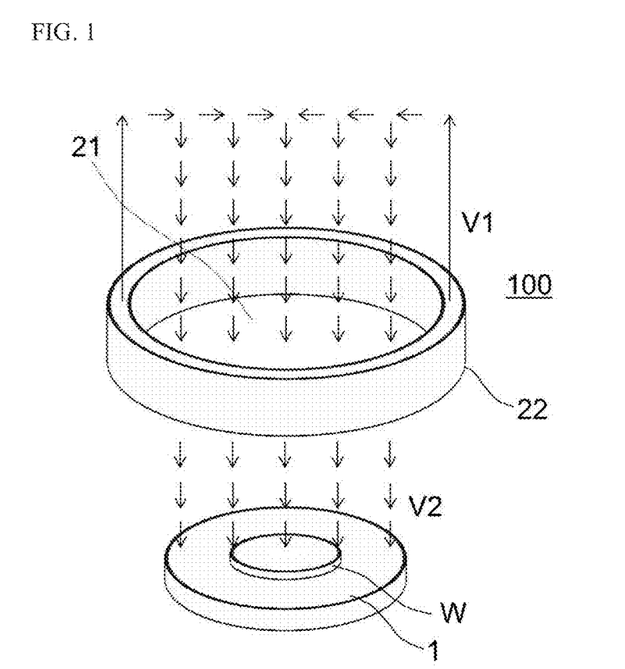
FIG. 1 is a schematic diagram showing the operating principle of how the columnar laminar flow generation device proposed by the present invention generates columnar laminar flows.

The operating principle of how the columnar laminar flow generation device proposed by the present invention generates columnar laminar flows is explained using FIG. 1.

While the columnar laminar flow generation device proposed by the present invention can blow out a gas in any direction, the following explains an example of a device that blows out a gas upward and generates downward columnar laminar flows. It should be noted that FIG. 1 is a schematic diagram that does not show parts not required for the purpose of explanation.

A columnar laminar flow generation device 100 proposed by the present invention blows out a replacement gas at the blow-out rate V1 (L/min) from a gas blow-out port 22 provided in the interior wall of an opening 21, in one direction vertical to the opening 21 (i.e., in the upward direction), and suctions the gas at the suction rate V2 (L/min) in the direction opposite to the one in which the gas is blown out (i.e., in the downward direction). At this time, the suction rate V2 (L/min) is set equal to or smaller than the blow-out rate V1 (L/min). The total area of the gas blow-out port 22 from which the replacement gas is blown out is smaller than the area of the opening 21 through which the suctioned gas passes, and therefore the part (V2) of replacement gas that has blown out strongly upward at the blow-out rate V1 is suctioned weakly downward and flows in the sequentially changing directions: upward, toward the center of the opening, and downward. The downward flowing replacement gas creates columnar laminar flows having uniform orientation and flow velocity, meaning that the columnar laminar flow generation device proposed by the present invention can generate downward columnar laminar flows passing through the opening 21.

Columnar laminar flows generated by the columnar laminar flow generation device proposed by the present invention generate near the region where a part (V2) of replacement gas that has blown out from the gas blow-out port 22 changes its direction of flow, and the remainder (V1-V2) changes its direction of flow to a direction other than toward the opening 21, and the columnar laminar flows are maintained until passing through the opening 21 and colliding with the processing target W. It should be noted that, if V1 is smaller than V2, columnar laminar flows can still be generated, but the outside air will mix into the columnar laminar flows.

A placement part 1 is positioned in a space whose outer periphery surface is constituted by extending the interior wall of the opening 21 in a direction vertical to the opening 21. In FIG. 1, the placement part 1 is positioned inside a cylinder whose outer periphery surface is constituted by extending the interior wall of the opening 21 in the direction vertical to the opening. The columnar laminar flows passing through the opening 21 continue to travel straight and collide with the processing target W placed on the placement part 1. Some processing is performed on the processing target W in an ambience replaced by columnar laminar flows. Here, preferably the placement part 1 and opening 21 are such that the shortest distance between the placement part 1 and the interior wall of the opening 21 is no more than 100 times the diameter of the smallest circle that includes the placement part 1. The shortest distance between the placement part 1 and the interior wall of the opening 21 is more preferably no more than 30 times, or even more preferably no more than 10 times, or most preferably no more than five times, the diameter of the smallest circle that includes the placement part 1.

The placement part 1 can be provided not only downward from, but also on the side of, diagonal to, or upward from, the opening 21, among others. When downward columnar laminar flows generate, the direction of the columnar laminar flows agrees with the direction of gravity and therefore suspended dust, etc., can be eliminated quickly. Also, the placement part 1 can be positioned on the side of the plane that includes the opening 21, where the replacement gas is blown out. Depending on the size, shape, etc., of the placement part 1 or processing target W, however, the gas that has collided with the placement part 1 or processing target W and changed its direction may collide with the replacement gas that has blown out from the gas blow-out port 22 and the flows of replacement gas blown out from the gas blow-out port 22 may be disturbed as a result. The location of the opening 21 needs to be determined according to the size of the placement part 1 or the orientation and shape of the processing surface of the processing target W, or according to the position, structure, etc., of the processing device that performs some processing on the processing target, based on the direction in which columnar laminar flows are to be generated.

Figure 2:
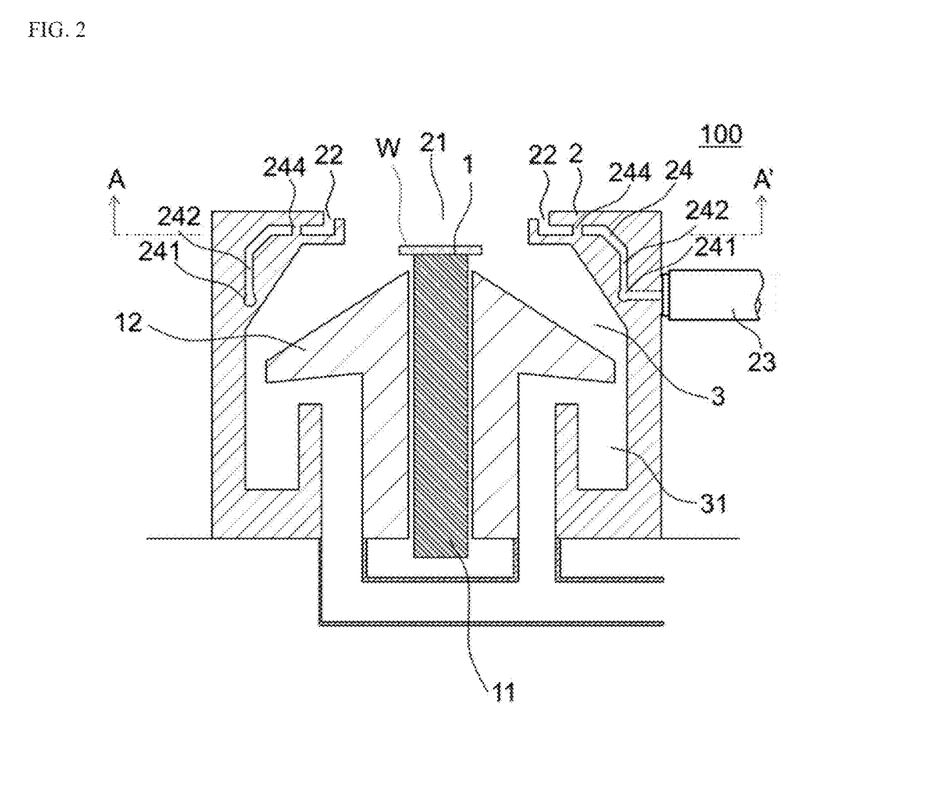
FIG. 2 is a perpendicular section view of an embodiment of the columnar laminar flow generation device proposed by the present invention.
Figure 3:
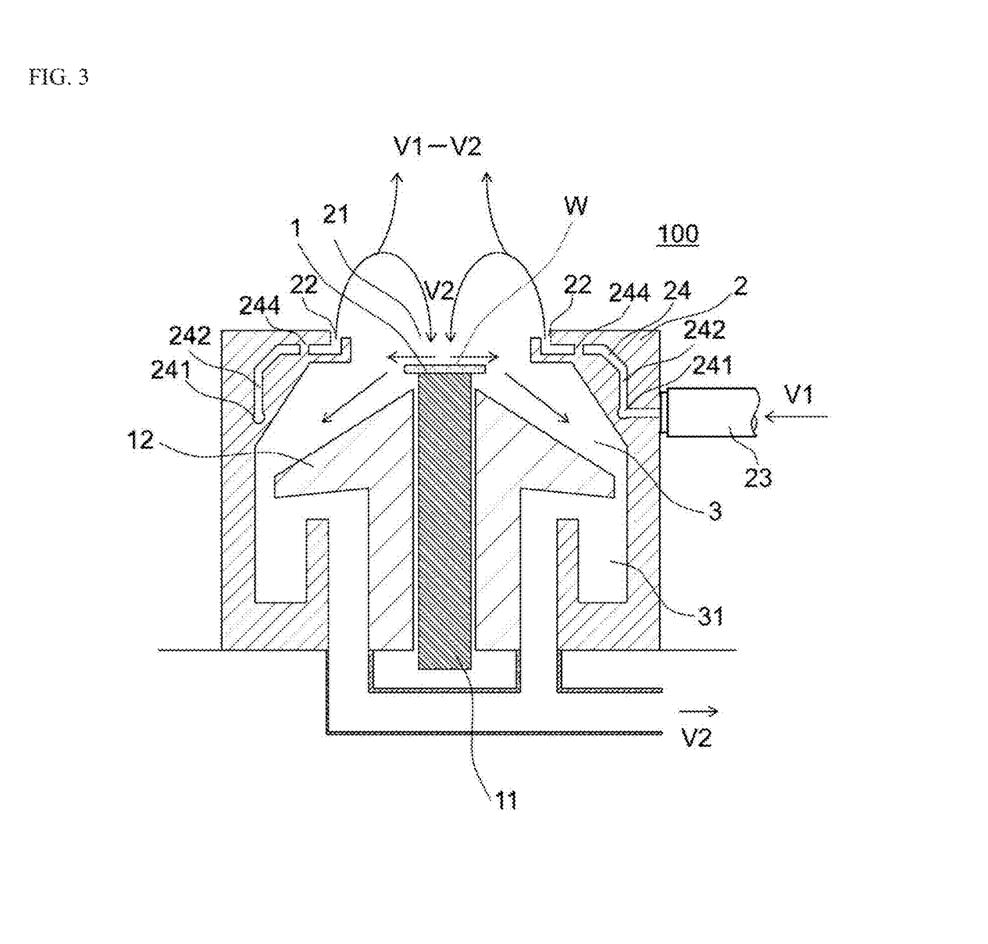
FIG. 3 is a perpendicular section view showing the flows of gas in an embodiment of the columnar laminar flow generation device proposed by the present invention.

An embodiment of the columnar laminar flow generation device proposed by the present invention is explained below. FIG. 2 shows a perpendicular section view of the columnar laminar flow generation device 100 representing the embodiment, while FIG. 3 shows the flows of gas in this perpendicular section.

The placement part 1 is for placing the processing target W on top. In FIG. 2, the placement part 1 represents the top edge of a rotating part 11 which rotates and moves up and down through a drive part (not illustrated). The rotating part 11 can have pickup tubes (not illustrated) for picking up the processing target W.

Even if the processing device (not illustrated) that performs processing on the processing target W operates only in one direction, the processing target W can be processed from various directions by rotating it together with the placement part 1. Also, by rotating the placement part 1 at high speed, a uniform coating film can be formed on the processing target W by means of spin coating.

The placement part 1 can move up and down, and as the placement part 1 moves up above the opening 21, the processing target W that moves sideways is placed onto the placement part 1 and then unloaded from the placement part 1.

The outer periphery of the rotating part 11 is covered with an outer cylinder member 12. The shape of the outer cylinder member 12 is not limited in any way, and it can be cylindrical or umbrella-shaped, for example. If this member is flanged, falling matter and coating solution, rinsing solution, etc., used for spin coating can be directed to drop into a trap 31 in the suction path as described in detail below.

A gas blow-out part 2 has an opening 21 and the opening 21 has, in its interior wall, a gas blow-out port 22 that blows out a gas in one direction vertical to the opening 21 (i.e., in the upward direction). Preferably the gas blow-out port 22 is positioned above the surface of the processing target W. Adjustment can be made by moving the placement part 1 up and down according to the thickness of the processing target W so that the gas blow-out port 22 is disposed above the surface of the processing target W. If the height of the gas blow-out port 22 is the same as or below the surface of the processing target W, the replacement gas that has blown out upward from the gas blow-out port 22 may hit the processing target W or placement part 1, depending on the size, shape, etc., of the processing target W or placement part 1, and collide with the gas spreading sideways, and the upward flows of replacement gas may be disturbed as a result.

The gas blow-out part 2 is where the replacement gas is supplied from a feed pipe 23 at the rate of V1 (L/min). The gas blow-out part 2 has a flow passage 24 inside for uniformly distributing the replacement gas, and the replacement gas supplied from the feed pipe 23 travels through the flow passage 24 and is uniformly distributed, and blows out uniformly from each part of the gas blow-out port 22 at the blow-out rate V1.

Figure 4:
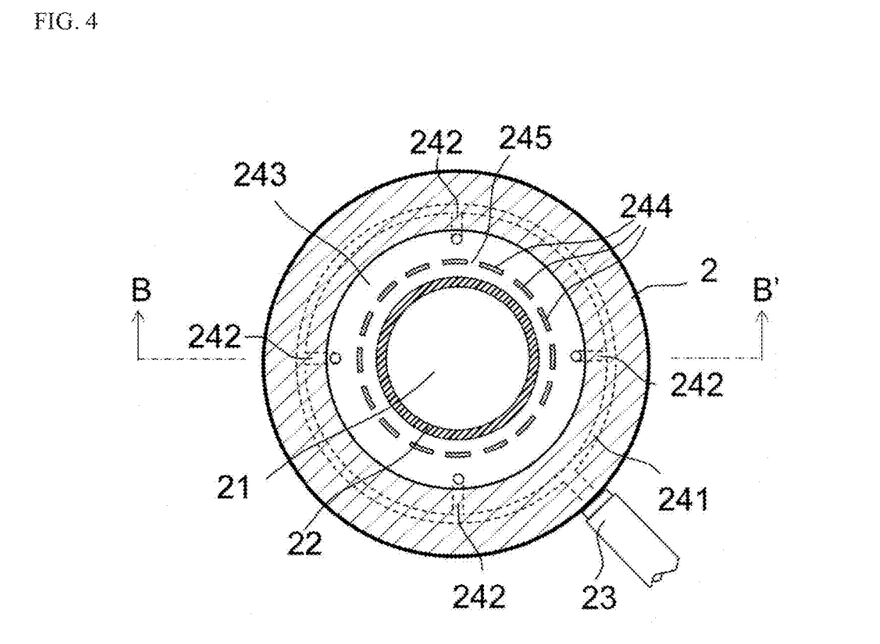
FIG. 4 is a horizontal section view of the gas blow-out part in an embodiment of the columnar laminar flow generation device proposed by the present invention.

FIG. 4 shows a horizontal section view of the gas blow-out part 2 in the columnar laminar flow generation device 100 representing one embodiment. The horizontal section view shown in FIG. 4 corresponds to a view of section A-A' in the perpendicular section view shown in FIG. 2, while the perpendicular section view shown in FIG. 2 corresponds to a view of section B-B' in the horizontal section view shown in FIG. 4. Also, in FIG. 4, the plane that includes the opening 21 represents the plane parallel with the page, while the direction vertical to the opening represents the direction vertical to the page.

The replacement gas supplied from the feed pipe 23 flows along a circular path 241 which is embedded in a manner surrounding the opening 21. The circular path 241 has connection paths 242 provided in four directions, and the replacement gas travels through the connection paths 242 and flows from the circular path 241 into a circular space 243 above. The circular space 243 is divided into the inner side and outer side by a distribution wall 244, and the distribution wall 244 has 16 slits 245. The replacement gas flows from the outer side to the inner side in the circular space 243, passes through the slits 245 and is thus distributed, and then blows out from the gas blow-out port 22 opening upward.

The internal structure of the gas blow-out part 2 shown in FIG. 4 is only an example and the internal structure is not limited to this in any way. For example, the circular space 243 can be divided into three or more sections by multiple distribution walls. In this case, the distribution walls are given incrementally more slits according to the sequence in which they are passed by the replacement gas. At this time, preferably the slits in the adjacent distribution walls are staggered so that the replacement gas cannot travel straight. Also, the distribution wall positioned farthest downstream can be formed with a silk screen in which numerous pores are formed. Here, the smaller the difference between the maximum value and minimum value of the flow velocity at each part of the gas blow-out port 22, the better; nevertheless, the flow velocity at each part of the gas blow-out port 22 need not be exactly the same because the replacement gas blown out from the gas blow-out port 22 in one direction vertical to the opening is suctioned in the opposite direction to self-generate columnar laminar flows in the opposite direction.

A gas suction path 3 is connected to the suction part of the pump, etc. (not illustrated), and formed in such a way that the gas is suctioned from the opening 21 in the direction opposite to the one in which the gas is blown out (i.e., in the downward direction). The gas suction path 3 suctions downward from the opening 21 the replacement gas that has blown out upward, and also suctions downward the gas that has collided with the processing target W and flowed sideways. It also suctions and removes the coating solution and rinsing solution that have scattered in the process of spin coating.

Preferably the internal section of a plane parallel with the opening 21 of the gas suction path 3 near the placement part 1 is rotationally symmetrical to the center axis of the opening 21. When the internal section of a plane parallel with the opening 21 of the gas suction path 3 near the placement part 1 is rotationally symmetrical to the center axis of the opening 21, the gas that has collided with the processing target W and spread radially can be suctioned uniformly downward, thereby reducing the disturbance of gas flowing on the surface of the processing target W. Also, a trap 31 for preventing falling matter, coating solution, rinsing solution, etc., from being suctioned in and reaching the suction part can be provided in the gas suction path 3.

In the columnar laminar flow generation device 100 proposed by the present invention, the remainder of the gas V1 (L/min) that has blown from the gas blow-out port 22, which has not become columnar laminar flows V1-V2 (L/min), diffuses to the periphery and upward gas flows generate in the opening 21. The upward gas flows keep the outside air in the peripheral region from contacting the columnar laminar flows, and therefore the generated columnar laminar flows consist only of the replacement gas. Also, the upward gas flows prevent fine dust, etc., from falling onto the processing target W. Furthermore, the remaining gas diffuses to the peripheral region, which increases the concentration of replacement gas in the outside air over time.

The columnar laminar flows pass through the opening 21, and because their flow rate is equal to the suction rate V2, the velocity of the columnar laminar flows passing through the opening 21 can be obtained from the area of the opening 21 and the suction rate V2. If the size of the opening 21 is constant, the velocity of the columnar laminar flows can be adjusted by V2. In other words, the columnar laminar flow generation device proposed by the present invention can generate columnar laminar flows of any velocity by adjusting the size of the opening 21 and the suction rate V2. Although not limited in any way, the velocities of columnar laminar flows that can be generated by the columnar laminar flow generation device proposed by the present invention can range from 5 mm/sec to 500 mm/sec, for example.

Also, V1 can be set according to the velocity of upward gas flows, whether the concentration of replacement gas in the peripheral region need to be increased or not, etc.

The type of replacement gas is not limited in any way, and clean air or nitrogen, or inert gas such as nitrogen or argon, or any gas whose temperature and humidity have been adjusted, can be used. Installing a high-function filter (not illustrated) in the feed pipe 23 that supplies the replacement gas to the gas blow-out port 22 is sufficient for purifying the replacement gas. With the columnar laminar flow generation device 100 proposed by the present invention, installing a high-function filter in the feed pipe 23 is all that is needed to purify the replacement gas, which allows for substantial reduction in the required quantity of high-function filters compared to when high-function filters are placed over the entire ceiling surface under the conventional method.

The cross-section shape of the columnar laminar flows generated by the columnar laminar flow generation device 100 proposed by the present invention approximates the shape of the opening 21. It should be noted that, since vortexes generate between the gas that blows out in one direction vertical to the opening 21 and the columnar laminar flows in the opposite direction, the cross-section shape of the columnar laminar flows is slightly smaller than the shape of the opening 21. In other words, the columnar laminar flow generation device 100 proposed by the present invention can generate local columnar laminar flows which pass through the opening 21 and whose size is roughly the same as that of the opening 21. Also, as mentioned above, the columnar laminar flow generation device 100 proposed by the present invention can generate columnar laminar flows of any velocity according to the suction rate V2.

Here, it should be noted that, if the cross-section area of the laminar flow is small, the laminar flow can be maintained even at low velocities. If the laminar flow has a large cross-section area, a wall-like wide interface is formed between the laminar flow and the outside air. As the flow of outside air collides with the wall-like interface, the flow cannot go around the interface and thus the interface is disturbed, and the laminar flow breaks as a result. If the laminar flow has a small cross-section area, on the other hand, the flow of outside air can continue to flow without entering the laminar flow, but by going around the laminar flow, and consequently the interface is not disturbed much and the laminar flow is maintained.

The columnar laminar flow generation device 100 proposed by the present invention, while capable of generating columnar laminar flows of any cross-section shape and velocity, is suitable for applications where laminar flows of small cross-section areas and low velocities are generated. Columnar laminar flows can have velocities of 5 mm/sec to 50 mm/sec, for example. As described above, laminar flows of small cross-section areas are not easily disturbed even at low velocities, so they can efficiently push out and discharge non-replacement gases. Because their cross-section area is small and velocity is low, these columnar laminar flows allow for substantial decrease in the required amount of replacement gas.

The columnar laminar flow generation device 100 proposed by the present invention can be used in various applications where the ambient gas is locally replaced. For example, it can be used suitably in a cleaning device, drying device, exposure device, etching device and other wafer processing device used in semiconductor and MEMS manufacturing, as well as in a rotary application device and ultraviolet light irradiation device. It can also be used suitably in a wafer processing device housed in an enclosure of pre-specified standard size, as part of a device manufacturing system based on the minimal fab concept proposed by the inventors of the present invention, as described in Japanese Patent Laid-open No. 2012-54414 and Japanese Patent Laid-open No. 2014-30034. In this wafer processing device, generation of laminar flows of clean replacement gas is required only where wafers are processed and at docking parts where sealed transfer containers are opened/closed. It should be noted that, while wafers of 0.5 inch (12.5 mm) in diameter are proposed in Japanese Patent Laid-open No. 2012-54414 and Japanese Patent Laid-open No. 2014-30034 mentioned above, the wafers handled on a wafer processing device fitted with the columnar laminar generation device proposed by the present invention are not limited to this size. Furthermore, the shape of the opening 21 is not limited to circle, and it can be an ellipse, oval, quadrangle, hexagon, dodecagon or other polygon. When the opening 21 is shaped as an ellipse, oval, rectangle, etc., the device can be utilized suitably in a coating device used for coating long films, etc., or in an ultraviolet light irradiation device, etc.

The columnar laminar flow generation device proposed by the present invention can generate laminar flows locally. The columnar laminar flow generation device proposed by the present invention can generate laminar flows solely in regions where the ambience must be controlled using laminar flows, and compared to the conventional uniform blow-out/exhaust structure, the required amount of replacement gas can be reduced to one-hundredth or less. Even when the flow velocity is increased for the purpose of controlling temperature and humidity, etc., the amount of replacement gas can be reduced to one-tenth the amount required under the conventional method or less. Less replacement gas means the peripheral equipment needed to control the replacement gas can be made smaller, and the energy, water, etc., needed to operate such equipment can be reduced substantially. The smaller peripheral equipment also makes it possible to save space, cut noise, reduce heat generation, etc.

EXAMPLES

Figure 5:
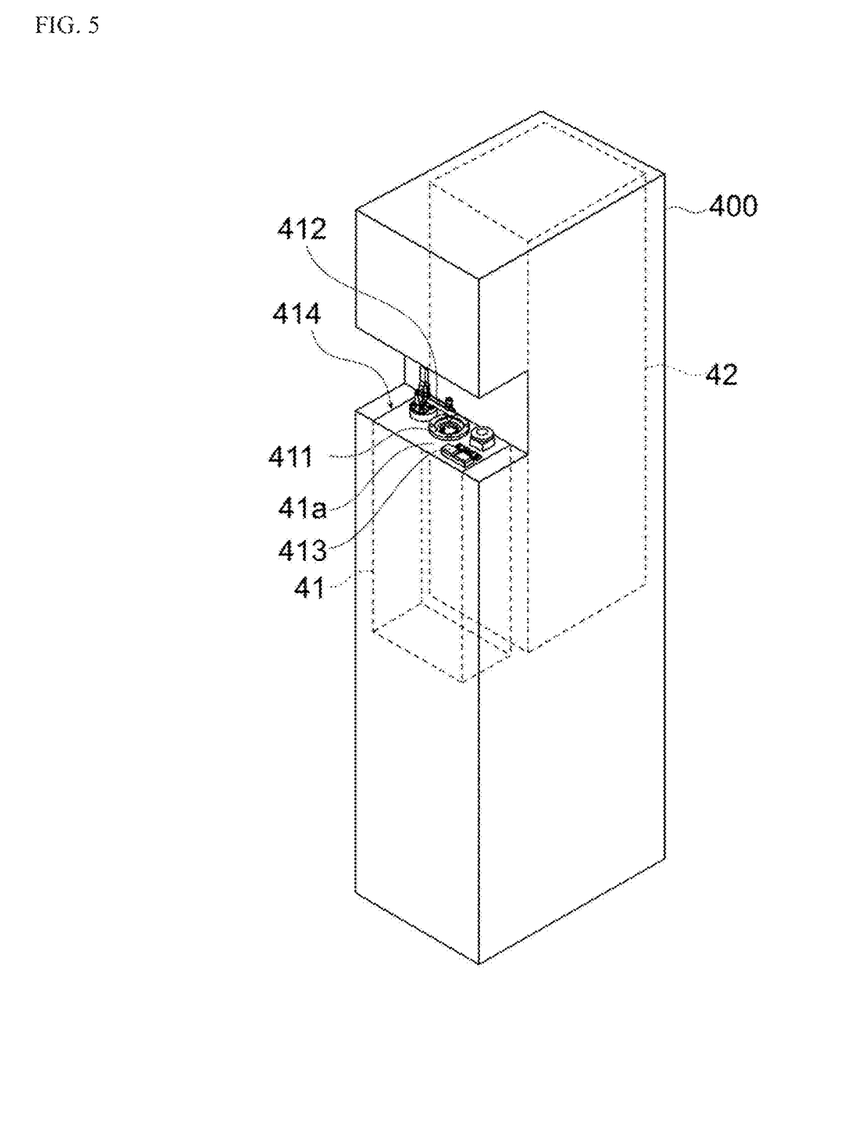
FIG. 5 is a concept diagram of the overall structure of a minimal resist coating device.

FIG. 5 shows a conceptual illustration of the overall structure of a minimal resist coating device.

A minimal resist coating device 400 has a device front chamber 41 where wafers stored in sealed transfer containers are taken out, and a processing chamber 42 where wafers are handled.

The device front chamber 41 is a chamber for taking out wafers stored in sealed transfer containers and transferring them to the processing chamber 42. Provided on a top plate 41a of the device front chamber 41 are a container placement table 411 on which to place a sealed transfer container, a hold-down lever 412 for applying pressure from above and thus securing in place the sealed transfer container that has been placed, and an operation panel 414 with operation buttons 413, etc., used for performing various operations. Also, the device front chamber 41 has a transfer robot (not illustrated) for loading the wafers taken out of the sealed transfer container into the processing chamber 42.

The processing chamber 42 receives wafers from the device front chamber 41 via a wafer transfer port which is not illustrated. The processing chamber 42 has a 30-cm square cross-section, and processing devices such as a transfer unit, HMDS (hexamethyl disilazane) processing unit, spin coater unit, resist nozzle, rinsing nozzle, baking unit, etc., are arranged therein (not illustrated).

Here, the resist film thickness varies depending on the temperature and humidity; for example, the higher the temperature, the thicker the film becomes. Also, higher wafer temperature results in thicker resist film because the coating solution dries more quickly. If the resist film thickness varies, the pattern width also changes even when the exposure condition is the same. This means that the temperature and humidity inside the spin cup of the spin coater unit where resist film is coated on wafers, must be kept constant without being affected by the heat source for the baking unit, etc., inside the processing chamber 42 or by the outside air temperature.

Under the conventional method using HEPA filters, etc., where laminar flows cannot be generated locally, laminar flows must be generated over the entire surface of the processing chamber 42 (900 cm$^2$) in order to control the internal temperature and humidity of the spin cup. Also, a flow velocity of approx. 350 mm/sec is required, which means that 30 cm×30 cm×350 mm/sec×60=1890 L/min of replacement gas is required.

On the other hand, the columnar laminar flow generation device 100 proposed by the present invention can generate laminar flows locally and guide the laminar flows solely into the spin cup where the temperature and humidity must be controlled. Also, the velocity of these laminar flows is adjustable. For example, when the size of the opening 21 is aligned to the inlet size (diameter 3.4 cm=10.2 cm$^2$) of the spin cup representing the minimum region requiring temperature and humidity control, and the velocity of columnar laminar flows passing through the opening 21 is set to 30 mm/sec and V1/V2, to 2.0, the flow rate of replacement gas V1 blowing out from the gas blow-out port 22 is calculated as $\pi \times (3.4/2)^2$ cm$^2$×30 mm/sec×60×2.0=3.3 L/min. It should be noted that it suffices to introduce into the regions of the processing chamber 42 other than the spin cup, outside air from which foreign matter has been removed through HEPA filters, etc., and whose temperature is not controlled.

In other words, by using the columnar laminar flow generation device 100 proposed by the present invention to locally generate laminar flows whose cross-section area is approx. 1% of the cross-section area under the conventional method (=10.2 cm$^2$/900 cm$^2$×100) and guide the laminar flows solely to the necessary regions, the temperature and humidity control required in semiconductor manufacturing can be achieved. At this time, the required amount of replacement gas is approx. 0.1 to 1% of the amount required under the conventional method.

It should be noted that the flow velocity is not limited to 30 cm/sec. If affected significantly by the heat source or outside air temperature, the flow velocity can be raised to increase the amount of gas colliding with the wafer per unit time and thereby control the temperature and humidity. Even if the flow velocity is raised ten times to 300 mm/sec to increase the flow rate, only 10% of the amount of replacement gas required under the conventional method or less, is sufficient. In reality, however, the minimal resist coating device does not require flow velocities as high as 300 mm/sec, because the heat source provided in the device is small and the amount of outside air introduced into the device is also small for easy temperature control.

Example 1

The columnar laminar flow generation device proposed by the present invention was installed in the spin cup of a minimal resist coating device.

The columnar laminar flow generation device 100 used in Example 1 conforms to the perpendicular section view shown in FIG. 2 above and the horizontal section view shown in FIG. 4 above. The replacement gas travels through the flow passage 24 having four connection paths 242 and 16 slits 245 and is distributed accordingly, and then blows out upward from the gas blow-out port 22.

The diameter of the opening 21 is 34 mm, and the width of the gas blow-out port 22 provided in the interior wall of the opening 21 is 2 mm.

The replacement gas is dry air of 24° C. in temperature that has passed through a HEPA filter, while the blow-out rate is 6 L/min, suction rate is 3 L/min, and velocity of columnar laminar flows calculated from the area of the opening and the suction rate is 55 mm/sec. Clean downflows are supplied to the processing chamber of the minimal resist coater from the HEPA filter installed on the top face.

A 0.5-inch silicon wafer was placed as the processing target on the placement part, with its top face positioned 1 cm below the gas blow-out port, to prepare resist film constituted by super LSI positive photo-resist.

Figure 6:
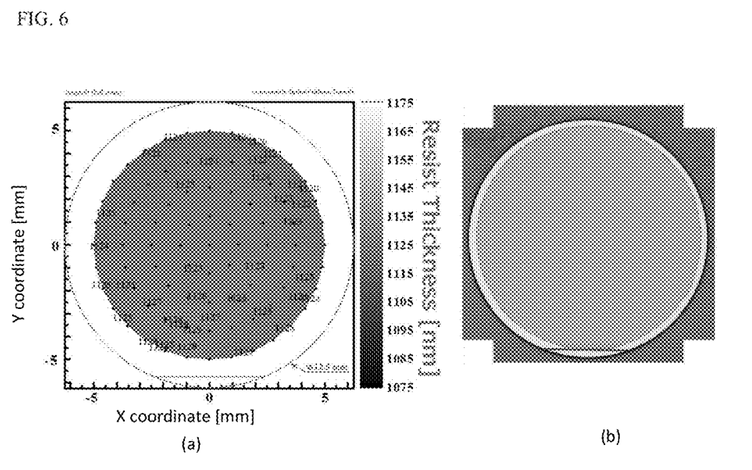
FIG. 6 shows (a) a thickness distribution, and (b) an optical microgram, of a resist film obtained in Example 1.

FIG. 6 shows a film thickness distribution as measured by the optical interference film thickness gauge, and an optical microgram, of the obtained resist film.

The average thickness of the obtained resist film was 1125 nm, while the standard deviation of film thickness was 2.0 nm.

Comparative Example 1

A resist film was prepared in the same manner as in Example 1, except that the gas blow-out port 22 of the columnar laminar flow generation device in Example 1 was changed to a cylindrical blow-out port 25 that blows out the replacement gas toward the center of the opening.

Figure 7:
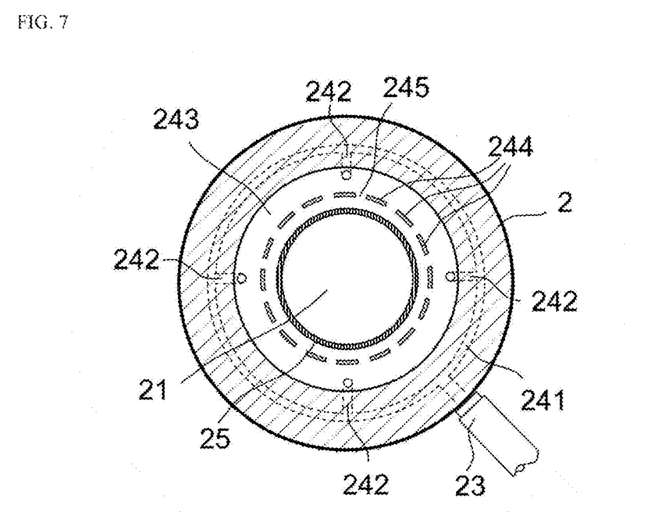
FIG. 7 is a horizontal section view of the blow-out part used in Comparative Example 1.

FIG. 7 shows a horizontal section view of the blow-out part in Comparative Example 1. The blow-out part used in Comparative Example 1 also has a flow passage with four connection paths 242 and 16 slits 245, just like the gas blow-out part 2 used in Example 1. After traveling through this flow passage and being distributed, the replacement gas blows out from the cylindrical blow-out port 25 toward the center of the opening 21. The cylindrical blow-out port 25 is a cylinder of 5 mm in height and 34 mm in diameter, constituted by a punching sheet with a triangle grid of openings of 0.75 mm in diameter.

Figure 8:
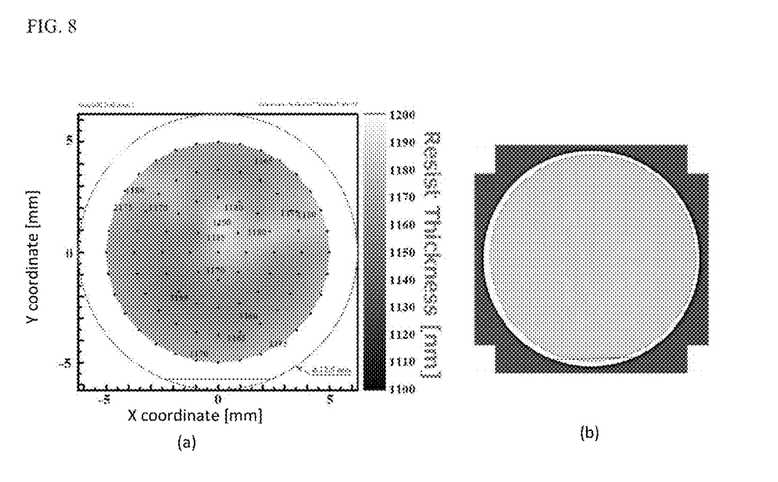
FIG. 8 shows (a) a thickness distribution, and (b) an optical microgram, of a resist film obtained in Comparative Example 1.

FIG. 8 shows a film thickness distribution and optical microgram of the obtained resist film.

The average thickness of the obtained resist film was 1169 nm, while the standard deviation of film thickness was 7.9 nm.

Comparative Example 2

A resist film was prepared in the same manner as in Example 1, except that the gas blow-out port 22 of the columnar laminar flow generation device in Example 1 was changed to a cylinder member 26 that blows out the replacement gas with strong force toward the center of the opening and that the distribution wall 244 was removed.

Figure 9:
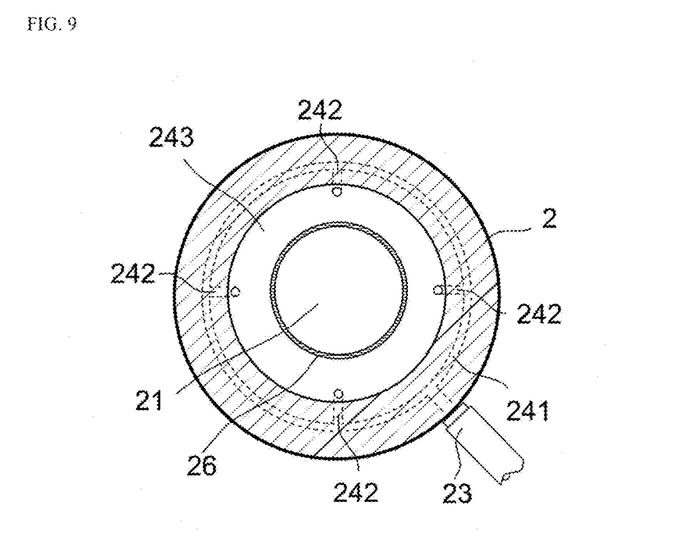
FIG. 9 is a horizontal section view of the blow-out part used in Comparative Example 2.

FIG. 9 shows a horizontal section view of the flow passage in Comparative Example 2. The cylinder member 26 is 34 mm in diameter and has a clearance of 1 mm in width between itself and the top face of the circular space 243.

In Comparative Example 2, the replacement gas spreads into the circular space 243 from the four connection paths 242 and then blows out strongly from the clearance of 1 mm in width at the top face of the cylinder member 26. It should be noted that the blow-out force is not uniform and becomes stronger at points closer to the connection path 242.

Figure 10:
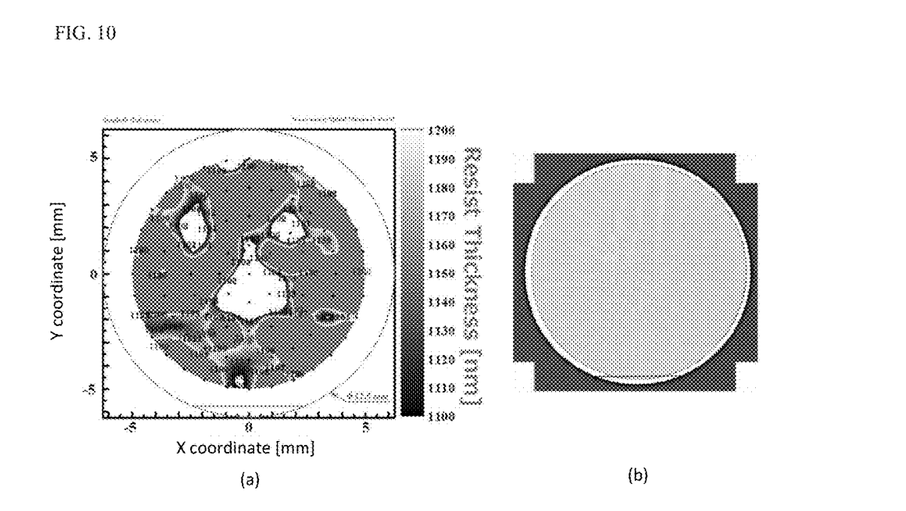
FIG. 10 shows (a) a thickness distribution, and (b) an optical microgram, of a resist film obtained in Comparative Example 2.

FIG. 10 shows a film thickness distribution and optical microgram of the obtained resist film.

The average thickness of the obtained resist film was 1250 nm, while the standard deviation of film thickness was 186 nm.

In Example 1 using the columnar laminar flow generation device proposed by the present invention, a resist film of uniform surface and no irregularities was obtained. The resist film obtained in Example 1 had a very small standard deviation of film thickness, or specifically 2.0 nm, and the coefficient of variation in film thickness (Standard deviation/ Average×100) was 0.18%, which is smaller than 0.5% being the coefficient of variation in film thickness with the resist films which has been put to practical use as obtained by coaters used for large wafers. This is because columnar laminar flows generated by the columnar laminar flow generation device proposed by the present invention were very uniform and spread uniformly in a radial pattern after colliding with the wafer, which prevented the liquid resist surface from being disturbed before baking.

The resist film obtained in Comparative Example 1 had a standard deviation of film thickness of 7.9 nm and a coefficient of variation of 0.68%, which are equivalent to the corresponding values of resist films fit for practical use. However, its film thickness distribution was not uniform and had some irregularities. The flows of gas blown out from the cylindrical blow-out port used in Comparative Example 1 have a vector pointing to the center of the concentric circle, and these flows, whose vector varies depending on the location, eventually gather at the center and become compressed. Accordingly, gas traveling toward the center collided with adjacent gas flows or oncoming gas flows and changed its direction up and down, and the resulting downward flows disturbed the liquid resist surface before baking and the resist film became irregular.

The resist film obtained in Comparative Example 2 had a standard deviation of film thickness of 186 nm and a coefficient of variation of 14.9%, indicating quite a non-uniform surface. The cylinder member 26 used in Comparative Example 2 has a narrow width of 1 mm in the part through which gas is blown out, so gas blows out with strong force. Also, the force of gas blown out from each part of the cylinder member 26 is not uniform. Accordingly, in Comparative Example 2 the velocities of gas flows traveling toward the center of the opening are generally high and not uniform, even though the blow-out rate is the same as in Comparative Example 1. As these gas flows collided at the center of the opening and generated quite disorderly downward flows that collided violently with the liquid resist surface before baking and disturbed it, the surface of the obtained resist film became rough.

In the present disclosure where conditions and/or structures are not specified, a skilled artisan in the art can readily provide such conditions and/or structures, in view of the present disclosure, as a matter of routine experimentation. Also, in the present disclosure including the examples described above, any ranges applied in some embodiments may include or exclude the lower and/or upper endpoints, and any values of variables indicated may refer to precise values or approximate values and include equivalents, and may refer to average, median, representative, majority, etc. in some embodiments. Further, in this disclosure, "a" may refer to a species or a genus including multiple species, and "the invention" or "the present invention" may refer to at least one of the embodiments or aspects explicitly, necessarily, or inherently disclosed herein. The terms "constituted by" and "having" refer independently to "typically or broadly comprising", "comprising", "consisting essentially of", or "consisting of" in some embodiments. In this disclosure, any defined meanings do not necessarily exclude ordinary and customary meanings in some embodiments.

The present application claims priority to Japanese Patent Application No. 2015-180083, filed Sep. 11, 2015, the disclosure of which is incorporated herein by reference in its entirety including any and all particular combinations of the features disclosed therein.

It will be understood by those of skill in the art that numerous and various modifications can be made without departing from the spirit of the present invention. Therefore, it should be clearly understood that the forms of the present invention are illustrative only and are not intended to limit the scope of the present invention.

We claim:

1. A columnar laminar flow generation device comprising:
a placement part on which to place a processing target;
a gas blow-out part having an opening; and
a gas suction path;
wherein:
the placement part is positioned in a space whose outer periphery surface is constituted by extending an interior wall of the opening in a direction vertical to the opening;
the opening has, in its interior wall, a gas blow-out port through which a gas is blown out in one direction away from the placement part and the opening;
an upper space to which the gas is blown out from the gas blow out port in the one direction is open to a peripheral region outside the columnar laminar flow generation device; and
the gas suction path is formed in a manner suctioning only a portion of the gas in a direction toward the placement part through the opening, which is opposite to the one direction in which the gas is blown out and in a manner diffusing a reminder of the gas, away from the placement part and the opening, through the upper space without passing through the opening.

2. A columnar laminar flow generation device according to claim 1, characterized in that the gas blow-out port is formed so that the gas is blown out upward.

3. A columnar laminar flow generation device according to claim 2, characterized in that the placement part is rotatable.

4. A columnar laminar flow generation device according to claim 3, characterized in that a feed pipe that supplies the gas to the gas blow-out part has a filter.

5. A wafer processing device characterized in that it is fitted with a columnar laminar flow generation device according to claim 4.

6. A wafer processing device characterized in that it is fitted with a columnar laminar flow generation device according to claim 3.

7. A rotary application device characterized in that it is fitted with a columnar laminar flow generation device according to claim 3.

8. A columnar laminar flow generation device according to claim 2, characterized in that a feed pipe that supplies the gas to the gas blow-out part has a filter.

9. A wafer processing device characterized in that it is fitted with a columnar laminar flow generation device according to claim 8.

10. A wafer processing device characterized in that it is fitted with a columnar laminar flow generation device according to claim 2.

11. A columnar laminar flow generation device according to claim 1, characterized in that the placement part is rotatable.

12. A columnar laminar flow generation device according to claim 11, characterized in that a feed pipe that supplies the gas to the gas blow-out part has a filter.

13. A wafer processing device characterized in that it is fitted with a columnar laminar flow generation device according to claim 12.

14. A wafer processing device characterized in that it is fitted with a columnar laminar flow generation device according to claim 11.

15. A rotary application device characterized in that it is fitted with a columnar laminar flow generation device according to claim 11.

16. A columnar laminar flow generation device according to claim 1, characterized in that a feed pipe that supplies the gas to the gas blow-out part has a filter.

17. A wafer processing device characterized in that it is fitted with a columnar laminar flow generation device according to claim 16.

18. A rotary application device characterized in that it is fitted with a columnar laminar flow generation device according to claim 16.

19. A wafer processing device characterized in that it is fitted with a columnar laminar flow generation device according to claim 1.

20. A method for generating columnar laminar flows, comprising:
   blowing out a gas from a gas blow-out port provided in an interior wall of an opening, in one direction vertical to the opening;
   suctioning a portion of the gas in a direction opposite to the one in which the gas is blown out from the opening; and
   generating columnar laminar flows by the portion of the gas passing through the opening, while diffusing a remainder of the gas to a peripheral region without becoming columnar laminar flows.

* * * * *